United States Patent [19]

Crawley et al.

[11] Patent Number: 4,958,100
[45] Date of Patent: Sep. 18, 1990

[54] ACTUATED TRUSS SYSTEM

[75] Inventors: Edward F. Crawley, Arlington; Nesbitt Hagood, Cambridge, both of Mass.

[73] Assignee: Massachusetts Institute of Technology, Cambridge, Mass.

[21] Appl. No.: 313,952

[22] Filed: Feb. 22, 1989

[51] Int. Cl.$^5$ .............................................. H01L 41/08
[52] U.S. Cl. ..................................... 310/328; 310/319
[58] Field of Search ............... 310/316, 317, 319, 326, 310/323, 328, 366, 369

[56] References Cited

U.S. PATENT DOCUMENTS

| | | | |
|---|---|---|---|
| 3,058,015 | 10/1962 | Nesh | 310/319 X |
| 3,179,823 | 4/1965 | Nesh | 310/326 X |
| 4,087,715 | 5/1978 | Myer | 310/328 X |
| 4,122,725 | 10/1978 | Thompson | 310/326 X |
| 4,158,787 | 6/1979 | Forward | 310/326 X |
| 4,363,991 | 12/1982 | Edelman | 310/316 |
| 4,453,141 | 6/1984 | Rosati | 310/317 X |
| 4,565,940 | 1/1986 | Hubbard, Jr. | 310/326 |
| 4,626,730 | 12/1986 | Hubbard, Jr. | 310/326 |
| 4,639,630 | 1/1987 | Rodloff et al. | 310/328 |
| 4,651,046 | 3/1987 | Ohya et al. | 310/328 |
| 4,721,447 | 1/1988 | Erckmann | 310/328 X |
| 4,742,261 | 5/1988 | Rich et al. | 310/328 |
| 4,849,668 | 7/1989 | Crawley et al. | 310/328 |

Primary Examiner—Mark O. Budd
Attorney, Agent, or Firm—Thomas J. Engellenner; Michael I. Falkoff

[57] ABSTRACT

A truss member includes a piezoelectric stack and a cylindrical shell formed of composite material surrounding the stack and bonded thereto, such that the axial load is distributed between the shell and the stack. The truss is fitted to a structural assembly via end pieces, and electrodes are attached to the stack, which may be selectively actuated to achieve different effects. In one aspect, a shunt or resonant feedback circuit damps a truss resonance mode; in another aspect an electrode bus attached to partial electrode surfaces on the stack allows the selective excitation of bending moments. The composite shell shields the stack from the environment, resulting in a robust control structure of low effective mass.

20 Claims, 5 Drawing Sheets

ACTUATED TRUSS SYSTEM

The U.S. Government has rights in this invention pursuant to Contract No. NAGW-21 awarded by the National Aeronautics and Space Administration.

TECHNICAL FIELD

This invention relates to piezoelectrically controlled devices, and more particularly to constructions wherein a piezoelectric element is attached to a structure and is electrically actuated to controllably vary the dimension, attitude or shape of the structure. It also relates to space structures, of the type wherein structural members such as trusses are assembled to provide a lightweight structure of high strength and precise dimensional tolerance.

BACKGROUND OF THE INVENTION

It is well known that piezoelectric materials exhibit a change in their dimensions upon the application of an electric potential thereto. This property has been exploited in numerous prior art constructions to provide electrically controlled moving parts, for effecting motions such as resonant vibrations, small bending deflections, and sharp striking impacts. The possibility has been suggested of constructing a member of an amorphous polymeric piezoelectric material, such as PVDF, and embedding control electrodes in the material for selectively introducing mechanical contractions to control the members. It has also been proposed to construct a moving stage or holder, wherein sets of mutually orthogonal piezoelectric stacks or cylinders are actuated to vary the x, y and z position of an instrument held by the stage.

In various constructions of the foregoing types, the piezoelectric elements may be made of a crystal of high strength and relatively small piezoelectric displacement, or may be formed by sintering or otherwise unifying a mass of piezoelectric grains or powder to achieve a larger member capable of a larger displacement when electrically excited. In the latter case, the elements themselves are generally brittle or friable, and may be vulnerable to environmental degradation from factors such as heat or moisture. Applicant believes that in such larger structures of the prior art, the piezoelectric elements are used for their Property of effecting a gross change in dimensions, and they do not constitute structural members in the sense of having a precise mass, strength and dimensions calculated to achieve load bearing, tensile, bending or stiffness properties This is natural, since the mechanical properties of the most easily worked piezoelectric materials would generally be considered unsuitable for use in structural elements, i.e., as beams or trusses. To employ such materials as add-ons to an independently-designed structural system, however, is inefficient and results in dead weight. There is thus a trade-off between the competing needs for a mechanical structure of low weight and a structure which may be electrically controlled.

OBJECTS AND SUMMARY OF THE INVENTION

It is an object of the invention to provide a controllable truss member.

It is a further object of the invention to Provide a controllable truss member of high stiffness and resistance to bending yet which is environmentally hardy and of light weight It is another object of the invention to Provide a continuous truss member having an internal Piezoelectric actuator for effecting extensional or bending movement of the member.

It is another object of the invention to Provide a composite truss member in a system wherein a passive electrical feedback loop damps the principal resonant modes of a structure including the member.

These and other desirable traits are obtained in a truss member having a tubular body with first and second ends adapted to fasten to a truss structure, wherein the body includes a cylindrical outer shell of composite material which tightly surrounds an inner shell consisting of one or more cylindrical piezoelectric elements. The piezoelectric elements are stacked end-to-end, and are attached along their outer walls to the outer shell in a manner to achieve a shear layer of minimal thickness. Electrical leads actuate the piezoelectric stack to control the truss member. Both the inner and outer shell serve as structural or load-bearing elements, and the outer shell has a stiffness which is effective to transfer the load born by the piezoelectric elements across cracks or defects in the elements and across the ends of adjacent elements, yet is sufficiently thin that relatively little energy is lost to the outer shell when the inner shell is actuated. The assembled truss has a stiffness which limits its bending deflection, and the inner stack bears a substantial portion of the axially-directed load on the truss member.

In preferred embodiments, the piezoelectric elements are radially poled, and undergo primarily a axial extension-contraction upon application of a charge. The electrode surfaces of these elements are formed on the inner and outer cylindrical surfaces of the elements. In different embodiments, half-, quarter-, or other partial cylindrical sectors of the elements have electrode surfaces along all or part of the stack, which are selectively actuated to provide bending moments to the truss in different directions. In a preferred system, at least one of the elements is operated as a sensor, and has its electrodes connected to a resistive shunt, or feedback circuit tuned to a truss resonance frequency, which returns a control signal to the piezoelectric element to effectively damp a principal truss resonance.

DETAILED DESCRIPTION OF THE ILLUSTRATED EMBODIMENTS

Figure 1:
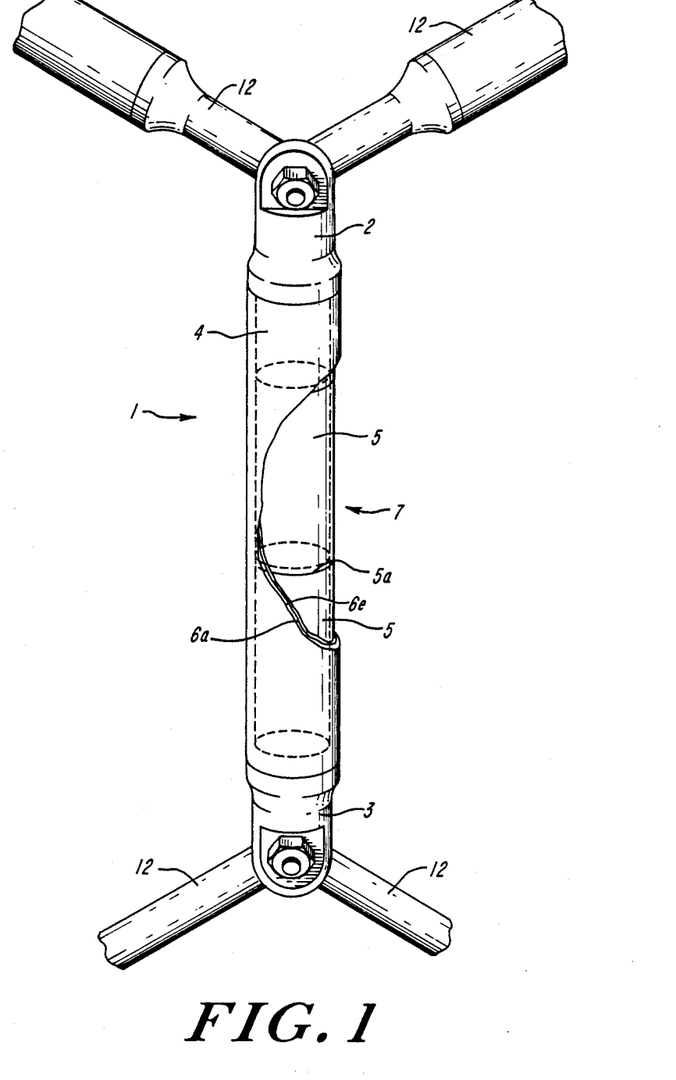
FIG. 1 shows a partially cut-away Perspective view of a truss member according to the invention.

FIG. 1 shows a truss member 1 according to the invention having end pieces 2, 3 which couple the truss into a structure 10 which illustratively consists of one or more other interconnected structural members 12 which collectively form a truss. Truss member 1 includes an outer cylindrical shell 4 which extends in an unbroken manner between the endpieces, and a plurality of cylindrical piezoelectrically active elements 5 which are stacked end-to-end with contacting end faces 5a to form an axially juxtaposed inner column of elements, collectively denoted 7, which also extends between the endpieces 2, 3. The outer shell is tightly fitted about and bonded to each of the elements 5, so that axial strain in the elements 5 is effectively coupled to the surrounding shell 4.

The shell 4 is formed of a composite material, consisting of fibers, or fabric made of fibers, which have a high tensile strength and which are embedded in a hardened medium such as an epoxy or other highly polymerized material. Examples of such fibers are single crystal carbon or boron fibers. The shell 4 is preferably composed of plural separate fiber-based layers or plies of material 6a...6e, which may be arranged with different fiber orientations to achieve an isotropic uniformity of strength, shear modulus, stiffness and the like. Shell 4 is preferably also of a sufficient thickness so that it effectively couples axial strains between portions of the piezoelectric stack 5 across any pits, cracks and discontinuities, as well as across the element-to-element endface boundaries 5a. With this construction the truss member 1 has a radially-varying but axially homogeneous composition which allows its mechanical properties to be readily measured, and its structural mechanics in a truss structure of different lengths to be modeled and predicted. For example, its resonant modes are readily calculated from the basic physical parameters of its materials, or may be measured by spectral analysis of the outputs of the piezoelectric elements.

Figure 2:
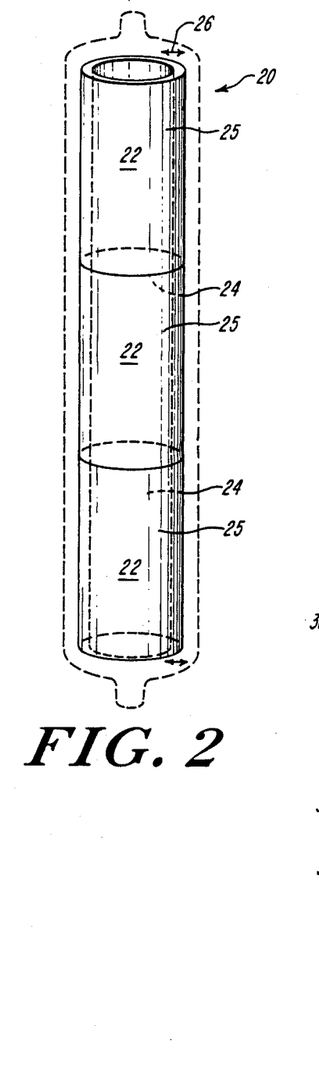
FIGS. 2 and 3 illustrate details of truss embodiments having piezoelectric elements with radially and axially placed electrodes, respectively.

FIG. 2 illustrates a detail of construction of a first embodiment 20 of the invention similar to that illustrated in FIG. 1. A truss 20 according to this aspect was constructed using a stack of cylindrical piezoelectric elements 22 each having dimensions of 1.985" length by 1.00" diameter by 0.033" wall thickness. The cylinders were radially poled, with the electrode polarity indicated in the Figure by an arrow 26, and the inner and outer cylinder surfaces were each entirely metallized with a silver electrode surface 24, 25. The parallel electrodes were thus separated by only 0.033". The cylinders were formed of a ceramic material sold by Vernitron Piezoelectric Co. as their PZT-5H material. Other prototype embodiments used a somewhat thicker cylinder of PZT-4 material formed in cylinders 1.5" long with 0.125" wall thickness, and having action characteristics of 1.137 $E_{-8}$ in/volt and 0.484 $E_{-8}$ in/volt along its $d_{33}$ and $d_{13}$ directions, respectively. The truss member 20 was assembled by successively soldering an electrode lead to each face of a cylinder, sliding it over a temporary mandrel having a slot to accommodate the inside electrode lead, and cementing the cylinder end-on to the previous cylinder of the stack, until a stack of the desired length was attained. The assembled stack was then placed in a clamping assembly until the cement hardened, after which a cold-cure glass/epoxy shell composed of 6 plies of material totalling 0.030" thick was built around the piezoelectric stack to form the outer shell 25 bonded to the inner stack.

In this embodiment, the shell material had a modulus of elasticity approximately equal to that of the piezoelectric cylinder, so that an effective and durable coupling was obtained between the outer surface of the stack and the shell inner surface. The overall stiffness of the shell was comparable to that of the stack, although with different fibers and binders the shell might be several times as stiff.

Figure 3:
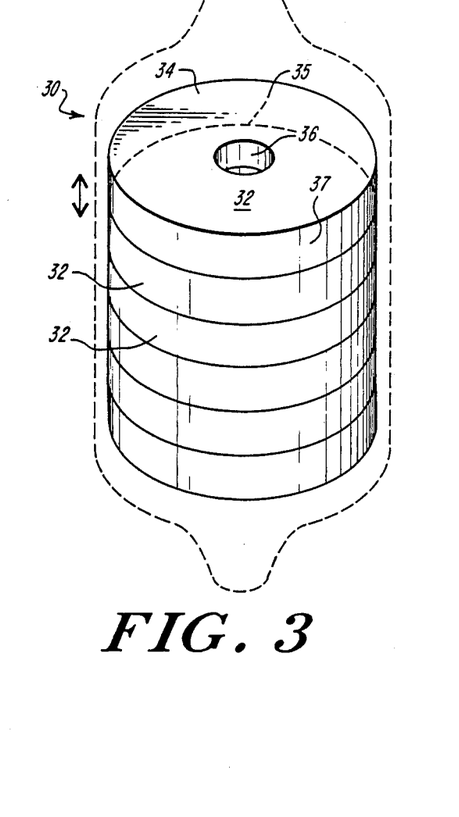

FIG. 3 illustrates a corresponding detail of a different embodiment 30 wherein the Piezoelectric elements 32 are cylinders of a relatively more washer-shaped aspect. In a prototype construction of this embodiment, the electrode surfaces 34, 35 are axially opposed upper and lower surfaces spaced approximately 25" apart, and the radially inner and outer surface 36, 37 of each washer are not metallized In this embodiment, relatively higher actuation voltages are required due to the thicker electrode spacing. Also, the fabrication of an electrode actuation bus or wiring harness is more complex, and the overall weight is greater than with the construction of FIG. 2; however, greater loads may be accommodated due to the increased cross-sectional area of the actuator stack.

Figures 2A, 3A:
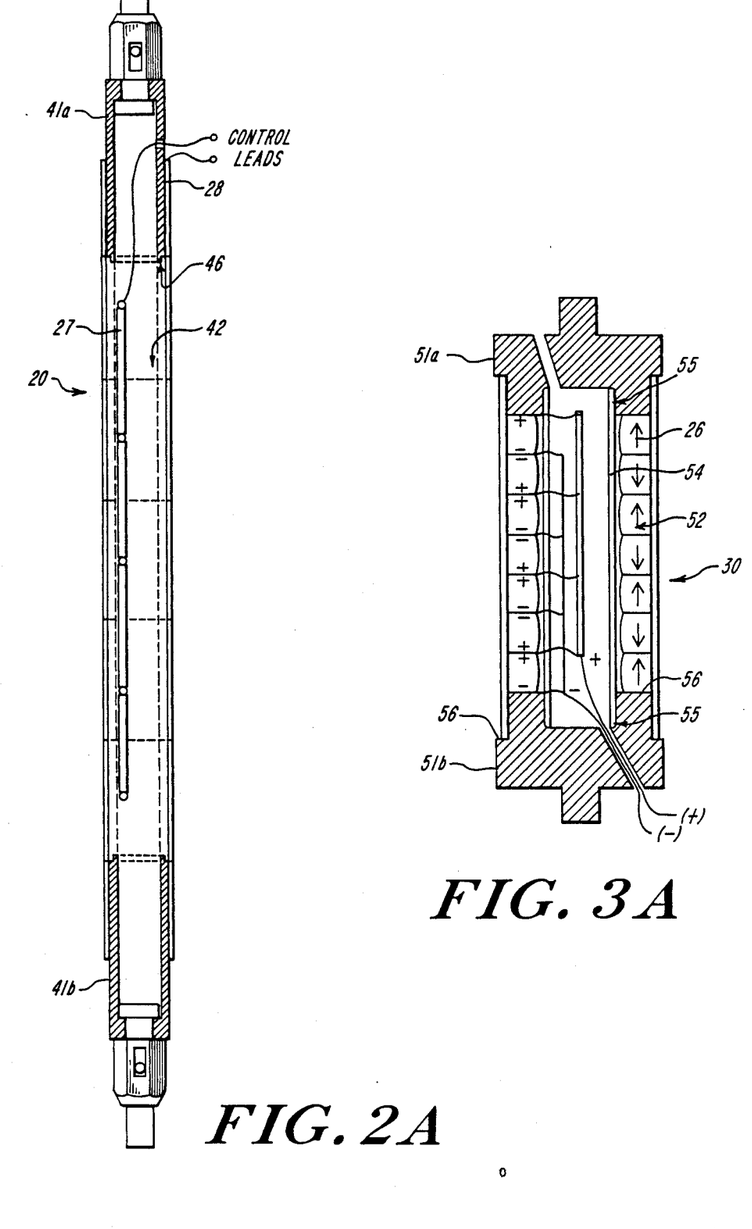
FIGS. 2A, 3A are schematic sectional views to illustrate electrode configurations for the trusses of FIGS. 2 and 3.

FIGS. 2A, 3A shows schematic cross-sectional views of trusses 20, 30 constructed with an inner column composed of the piezoelectric elements of FIGS. 2, 3, respectively. The basic construction in each case involves a pair of end caps 41a, 41b (or 51a, 51b), with both the piezoelectric stack 42, (52) and the surrounding composite shell held in load-bearing relation between the caps. As shown, each end cap has a shoulder portion 46 (56) contacting the shell and the stack in a thrust-transmitting relationship. More generally, the shell may extend beyond the stack ends, and the caps may contact only the shell, with the load being distributed via the end portions of the shell to both the stack and shell in the intermediate portion of the truss member. FIG. 3A additionally shows a tube 54 which in this embodiment is used as a mandrel for assembly of the stack. Threaded connectors 55 are affixed to the tube to allow the end caps 51a, 51b to be screwed down into a load-transmitting position, and to force-bias the stack elements in compression In the embodiment of FIG. 2A, two electrode buses 27, 28 connected to the interior and exterior electrodes, respectively, pass through an end cap to a control unit. In the embodiment of FIG. 3A, the electrode structure is more complex due to the axial polling of the elements In this case, the stack 52 is formed of a number of pairs of adjacent elements of opposed polarity, with one electrode lead attached to the common face of each pair, and a lead of opposite polarity attached to the next higher or lower common face. The direction of Polarity of each disc is indicated by a polarity arrow 26. The Figure shows n+1 electrode wires for a stack of n elements, each of which is connected to a(+) or a(−) bus, thus having only two lead-out connections.

Figure 4:
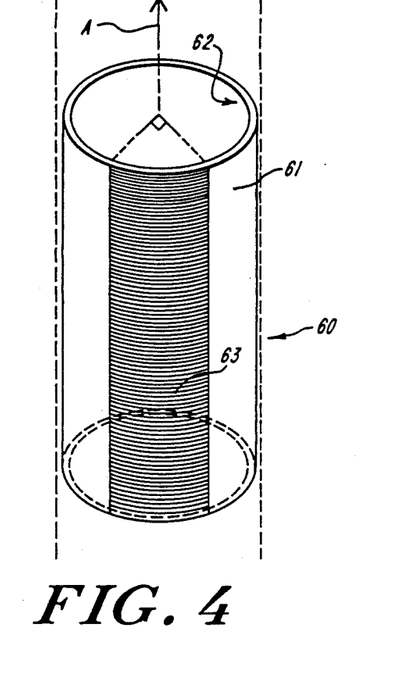
FIG. 4 shows a radially poled truss member with partial electrodes.

FIG. 4 shows a different embodiment of a piezoelectrically controllable truss member 60, having an overall construction similar to those of FIGS. 1 and 2A. In this embodiment, the individual piezoelectric elements 61 of the stack are radially poled but, rather than having their entire inner and outer surface each formed as a single electrode, at least one of the surfaces has a metallized partial electrode surface which extends only around a partial circumference of the element. For ease of illustration, element 61 is shown having a continuous inner electrode surface 62, and an outer electrode surface 63 illustrated as covering a ninety degree sector of the outer surface, i.e., a quarter-cylinder. When an actuating potential is applied to the inner and outer electrode surfaces, the portion of the piezoelectric element within the angular segment under electrode surface 63 will expand or contact along its axis A, while the remainder of the element not directly between the two electrodes will remain in its relaxed or unactuated state.

Figure 5A:
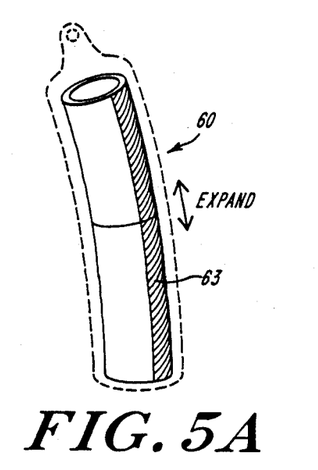
FIGS. 5A–5C illustrate the embodiment of FIG. 4 when electrically actuated.
Figure 5B:
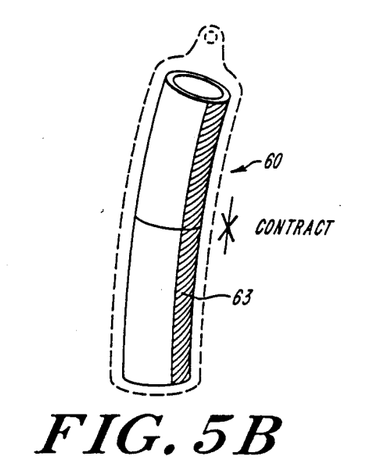
Figure 5C:
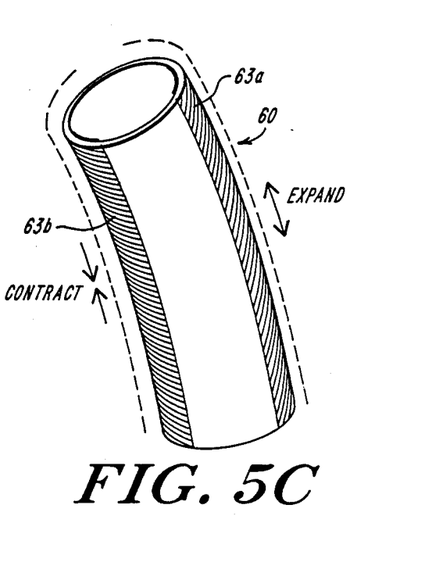

FIGS. 5A–5C illustrate the effect of such actuation on the truss member. In FIG. 5A the piezoelectric stack is actuated to extend along its right hand side, resulting in a leftward bending. In FIG. 5B the stack is actuated with a reversed electrical signal to contract along its right hand side. In this case, the truss member bends to the right. The two types of actuation are accompanied by an increase and a decrease, respectively, in the truss length.

By providing disjoint inner and outer electrodes on each of the left and right hand sides of a piezoelectric cylinder, it is possible to actuate one pair of electrodes to expand one side, while actuating a different pair with a signal of opposite polarity to contract the opposite side. FIG. 5C shows the deflection produced by such a control regimen. The deflection is greater than that produced by actuating a single side with the identical voltage.

It should be understood that the illustration of an exterior partial electrode in FIG. 4 was selected for clarity of illustration. If practice, it is preferred to form the partial electrode surfaces on the inner face of each element, so that the buses for actuation lie within the cylinder, are protected by the surrounding structure and do not complicate the construction of the outer shell. Further, the invention contemplates plural such partial electrodes on a single element Piezoelectric cylinders are commercially available having their entire inner and outer surface 1 metallized. Starting with such a completely metallized cylinder, an angular array of partial electrodes is easily formed by scraping or etching lines to separate portions of a single continuous electrode into segments of the desired size and shape. Preferably, the spacing and number of such electrode segments forms an array with individual electrode elements covering angular segments of under one quarter circumference of the cylinder. In that case, by activating different segments in an axially or angularly progressing sequence, it is possible to excite a flexural or torsional wave, respectively, in the truss member as well as to achieve a static bending or twisting displacement. In a practical application, such excitation may be desired to counteract a naturally-occurring resonance, or may be used to provide a desired sweep, scan or dithering motion. Furthermore, bending motions are preferably effected by actuating pairs of electrodes at opposite circumferential locations around the truss in opposite (extensional/contractile) senses to achieve greater actuation efficiency.

Figure 6:
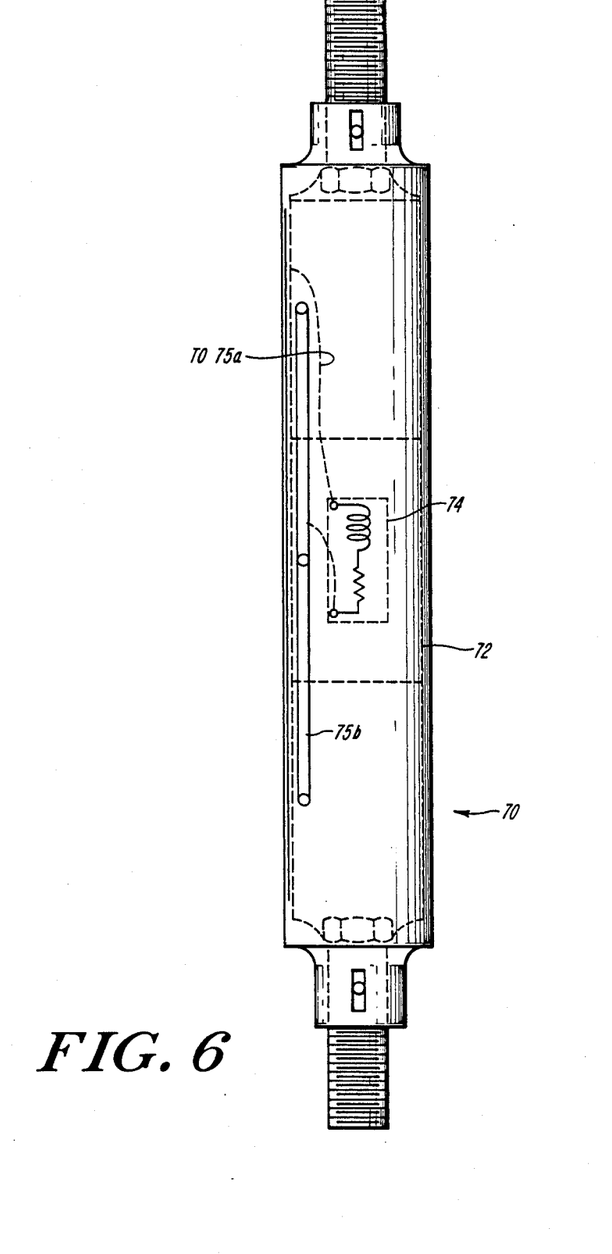
FIG. 6 shows a self-damping electromechanical truss system according to another aspect of the invention, having a passive feedback network.

In one preferred system using a truss member as shown, for example, in FIG. 1 or 2A, the principal resonance modes of the completed and installed truss structure are measured or calculated, and at least one piezoelectric element is used as a sensor to produce an output due to strain caused by a resonance mode. The output is connected by a shunt or other feedback circuit to the piezoelectric element, thus modifying the mechanical properties of the element so as to effectively damp the sensed resonance mode or alter the shape of the structure. FIG. 6 shows such a structure, for use in a passive stabilization system.

As illustrated in FIG. 6, a truss member 70 has at least one of its piezoelectric actuator elements 72 connected to a feedback circuit 74. Actuator element 72 is selected as the piezoelectric element located closest to the position of greatest axial strain for a particular resonance mode of the truss structure in which the member is assembled. The signals generated by element 72 are connected via electrodes 75a, 75b to the circuit 74, which in the illustrated embodiment contains a resistance and an inductance element selected to form a resonant circuit, together with the capacitance of the piezoelectric element, which resonates at approximately the same frequency as the particular resonance mode of the structure which it is desired to damp. At resonance, the circuit provides an amplified phase-inverted feedback signal, which drives the element in an opposite sense to that caused by the structural resonance, thus damping the original mechanical effect.

In alternate embodiments circuit 74 may comprise a simple low-resistance shunt between opposed electrodes of piezoelectric element 72. In this case, the charge generated by a strain in the truss is dissipated in the resistor. In effect, as the amplitude of a resonance mode increases, the strain-induced charge is dissipated so that element 72 becomes an increasingly lossy material under higher strain conditions. This effect damps the selected resonance. In preliminary experiments, the provision of a resistive shunt in this manner was found to provide an effective damping mechanism By employing an RL resonant shunt across the electrodes tuned to a resonant mode, the efficiency of operation was increased.

The provision of such a damping structure requires the initial measurement of truss resonance modes and the hard-wired attachment of a shunt or resonant circuit, but does not require subsequent monitoring of vibration levels or any real-time signal analysis. The circuitry is both environmentally hardy and fail-safe in its operation.

In one prototype embodiment, a five-meter long truss was constructed with truss members each having a length of about one-half meter. The structure had a principal resonance frequency of 40 Hz was constructed with a sensing/damping sensor located to receive maximal strain from the first bending resonance of the truss, which was about 40 Hz. A feedback resonator 74 consisting of a 7.29 Henry inductance coil and a 248.7 ohm resistance was coupled to the sensor, which had an inherent capacitance of 2.17 microfarads. This "tuned" the circuit to a resonance slightly above the 40 Hz truss resonance, and resulted in effectively damping the observed bending mode resonance of the truss. For smaller or stiffer truss members, significantly smaller inductance and capacitance elements can be used to achieve such passive electromechanical damping. Generally, the resistive or resonant circuit elements may be located at the piezoelectric element, within the shell of the truss member Several factors relating to the construction of different truss embodiments are also mentioned at this point for completeness. Generally, in fabricating trusses as shown in the Figures, it is desired to provide a shell of composite material, e.g., epoxy with glass fibers, or a carbon- or boronfiber based material, which has a sufficient strength to bear a significant portion of the truss load, and to transmit the load from the end caps into the stack, and across imperfections and joints of the Piezoelectric stack, as well as to limit total bending displacements of the stack to prevent breakage or crumbling of the stack. For piezoelectric cylinders 0.030" thick, a 0.030" thick outer shell of epoxy-glass composite was found a suitable, with the fibers laid up in a 0-90° alteration to provide both axial and radial stiffness. For larger piezoelectric elements such as those shown in FIGS. 3, 3A, an outer shell construction of lesser stiffness was deemed serviceable, in view of the lesser fragility of the stack. While a thicker shell could be employed in this latter case, it was found that thicker shell dimensions result in less effective truss actuation owing to the relatively greater energy passing into the outer shell.

In the embodiment of FIGS. 3, 3A, applicant used a ±45° ply orientation to achieve a Poison effect coupling of the radial and axial components together. This construction allows one to utilize the radial component of piezoelectric element actuation more effectively by converting circumferential expansion to axial motion.

It is to be noted that when employing a conductive composite material, such as a carbon fiber material, it is preferable to use the exterior electrode surface as a common ground for all piezoelectric elements. Partial electrode surfaces, if they are provided, are formed on the radially inner electrode. In that case it is unnecessary to insulate the elements from the composite shell, and one may allow the fibers to conductively interconnect different elements along the outer shell of the truss member.

This completes a description of the invention and certain preferred embodiments thereof. It will be understood that the invention has been described in relation to these particular embodiments for purposes of illustration only, and that it is not limited to such particular constructions, but rather encompasses within its scope diverse other constructions of like substance. The principles of construction and salient features having been the described, various modifications and variations will occur to those skilled in the art, and all such modifications and variations are considered to be within the scope of the invention, as set forth in the claims appended hereto.

What is claimed is:

1. A truss member comprising
   an elongate cylindrical shell having first and second endpieces adapted to couple to a truss structure and place said shell in load-bearing relation to the structure, said shell being formed of a composite material,
   a plurality of cylindrical elements of Piezoelectric material axially juxtaposed in said shell to form a load bearing inner column extending between said first and second endpieces, and
   conductive means for interconnecting a circuit with opposed faces of the cylindrical elements to actuate said piezoelectric elements, and
   wherein said cylindrical shell is fitted about and bonded to said plurality of cylindrical elements to form a radially-varying axially-homogeneous truss member.

2. A truss member according to claim 1, wherein said cylindrical elements are radially poled and are operative when actuated to vary the length of the truss in an axial direction.

3. A truss member according to claim 2, wherein a said cylindrical element has an electrode surface which is a partial cylindrical surface effective when actuated to bend said truss member.

4. A truss member according to claim 1, wherein said circuit comprises an electrical shunt between said opposed faces.

5. A truss member according to claim 4, wherein said shunt together with intrinsic capacitance of a said piezoelectric element forms a resonant circuit.

6. A truss member according to claim 1, wherein said elements and said shell are attached along a cylindrical surface to each other in load-sharing relation.

7. A truss member according to claim 1, wherein the stiffness of said shell is approximately impedance-matched to that of said cylindrical elements.

8. A truss member comprising
   a cylindrical column of piezoelectric material having first and second ends along an axis, and also having actuating electrodes on radially opposed surfaces thereof,
   a shell of load-bearing material contacting the exterior of said column between said first and second ends to couple a load carried by said column along the length of said shell, and
   end connector means coupled to opposing ends of said shell for attaching said column and shell in a truss,
   wherein said shell has a stiffness of about one to five times that of the cylindrical column and a thickness not substantially greater than that of the cylindrical column.

9. A truss member comprising
   opposed endpieces axially spaced along a longitudinal axis and each including means adapted for mechanical interconnection with a load or load-bearing element,
   an internal first and an external second column held in concentric parallel load bearing relation between the opposed endpieces,
   wherein aid internal first column is formed of a piezoelectrically actuatable material, and said external second column includes a shell of structural load-bearing material surrounding and supporting said first column in isolation from the environment, said second column being attached to said first column in load-sharing relation to said first column such that it is extended or contracted by extension or contraction of the piezoelectrically actuable material.

10. A Controllable truss member comprising
    a tubular structural member having a central axis and an interior face,
    a hollow piezoelectric core fitted in said tubular member and mechanically coupled to said interior face, such that said core and said tubular structural member share a load directed along said central axis, and
    electrode means attached to said piezoelectric core for interconnecting the core with control circuitry so as to selectively vary a mechanical property of the truss member by application of a control signal.

11. A controllable truss member according to claim 10, wherein said tubular structural member is formed of a composite material.

12. A controllable truss member according to claim 11, further comprising control means for applying control voltages to said electrodes for controlling said member.

13. A controllable truss member according to claim 12, wherein said control means controls bending of said member.

14. A controllable truss member according to claim 12, wherein said control means applies a voltage generated by stress in said member to damp a resonance of a truss structure including the member.

15. A controllable truss member according to claim 10, wherein said composite material includes Plies oriented for converting radial stress of said member to axial stress.

16. A controllable truss member according to claim 10, wherein said electrode means includes a partial cylindrical surface of said core.

17. A controllable truss member according to claim 12, wherein said control means includes resonant feedback means for developing a phase shifted resonant signal from piezoelectrically generated charge on said electrodes to damp a selected resonance in said member.

18. A controllable truss member according to claim 17, wherein said resonant feedback means has a resonance frequency, when connected to said electrodes, approximately equal to a resonance of a structure containing said truss member.

19. A truss structure comprising
a plurality of elongate members each having first and second ends, various ones of said ends being connected together at lattice points so as to constitute said truss structure,
one of said elongate members including an inner cylindrical column of piezoelectric material covered by and bonded to an outer cylindircal column of composite material, and
means for applying a signal to the piezoelectric material of the inner column to attenuate a resonance of said truss structure.

20. A truss structure according to claim 19, wherein said means for applying a signal includes a passive circuit shunt located in said one elongate member, and said signal is a feedback signal formed from strain-induced charge on the piezoelectric material of said member.

* * * * *

UNITED STATES PATENT AND TRADEMARK OFFICE
CERTIFICATE OF CORRECTION

PATENT NO. : 4,958,100

DATED : September 18, 1990

INVENTOR(S) : Edward F. Crawley et al.

It is certified that error appears in the above-identified patent and that said Letters Patent is hereby corrected as shown below:

Column 1, line 52, replace "properties This" with --properties. This--.

Column 3, line 53, replace "1.137 $E_{-8}$ in/volt and 0.484 $E_{-8}$ in/volt" with --1.137 $E^{-8}$ in/volt and 0.484 $E^{-8}$ in/volt--.

Column 4, line 40, replace "compression " with --compression.--

Column 6, line 27, replace "mechanism By" with --mechanism. By--.

Column 6, line 56, replace "truss member " with --truss member.--.

UNITED STATES PATENT AND TRADEMARK OFFICE
CERTIFICATE OF CORRECTION

PATENT NO. : 4,958,100

DATED : September 18, 1990

INVENTOR(S) : Edward f. Crawley et al.

It is certified that error appears in the above-identified patent and that said Letters Patent is hereby corrected as shown below:

Column 9, line 6, replace "Plies" with --plies--.

Signed and Sealed this

Tenth Day of March, 1992

Attest:

HARRY F. MANBECK, JR.

*Attesting Officer*   *Commissioner of Patents and Trademarks*